(12) United States Patent
Huang et al.

(10) Patent No.: US 8,004,842 B2
(45) Date of Patent: Aug. 23, 2011

(54) HEAT DISSIPATION DEVICE FOR COMMUNICATION CHASSIS

(75) Inventors: Chiu-Mao Huang, Sinjhuang (TW); Chang-Mou Huang, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 145 days.

(21) Appl. No.: 12/470,691

(22) Filed: May 22, 2009

(65) Prior Publication Data

US 2010/0296250 A1 Nov. 25, 2010

(51) Int. Cl.
*H05K 7/20* (2006.01)
(52) U.S. Cl. ......... 361/700; 361/699; 361/714; 361/704
(58) Field of Classification Search .................. 361/200, 361/700, 699, 704, 714; 165/104.26
See application file for complete search history.

(56) References Cited

U.S. PATENT DOCUMENTS

| | | | | |
|---|---|---|---|---|
| 5,339,214 A * | 8/1994 | Nelson | ........................... | 361/695 |
| 5,398,161 A | 3/1995 | Roy | | |
| 5,424,913 A * | 6/1995 | Swindler | .................. | 361/679.54 |
| 5,731,954 A * | 3/1998 | Cheon | ........................... | 361/699 |
| 6,028,769 A * | 2/2000 | Zurek | ........................... | 361/704 |
| 6,088,223 A * | 7/2000 | Diemunsch | ..................... | 361/690 |
| 6,125,035 A * | 9/2000 | Hood et al. | ................ | 361/679.47 |
| 6,234,240 B1 * | 5/2001 | Cheon | ........................... | 165/80.3 |
| 6,657,121 B2 * | 12/2003 | Garner | ......................... | 174/16.3 |
| 6,804,117 B2 * | 10/2004 | Phillips et al. | ................ | 361/700 |
| 7,096,928 B2 * | 8/2006 | Phillips et al. | .......... | 165/104.21 |
| 7,457,118 B1 * | 11/2008 | French et al. | .................. | 361/700 |
| 7,548,421 B2 * | 6/2009 | Malone et al. | ................ | 361/695 |
| 7,791,875 B2 * | 9/2010 | Kumano et al. | .......... | 361/679.49 |
| 2006/0246952 A1 | 11/2006 | Widmayer et al. | | |
| 2010/0089555 A1 * | 4/2010 | Chen | ....................... | 165/104.31 |

* cited by examiner

*Primary Examiner* — Anatoly Vortman (57) ABSTRACT

A heat dissipation device for communication chassis, which includes an enclosure and at least one second heat pipe assembly. The enclosure includes at least one first copper heat absorption component, at least one first heat pipe assembly and multiple radiating fins disposed on an outer surface of the enclosure. The first heat pipe assembly is connected with the first copper heat absorption component and a section not in contact therewith so as to transfer heat absorbed by the first copper heat absorption component to the section to dissipate the heat. The second heat pipe assembly penetrates through the radiating fins of the enclosure for quickly and uniformly distributing the heat to all the radiating fins. Therefore, the heat conduction efficiency is greatly enhanced to provide better heat dissipation effect for the communication chassis.

16 Claims, 10 Drawing Sheets

HEAT DISSIPATION DEVICE FOR COMMUNICATION CHASSIS

FIELD OF THE INVENTION

The present invention relates generally to a heat dissipation device for communication chassis, and more particularly to an improved heat dissipation device for communication chassis, which includes an enclosure, a cover body and at least one second heat pipe assembly. The second heat pipe assembly penetrates through the radiating fins of the enclosure and the cover body for quickly and uniformly distributing heat to all the radiating fins. Therefore, the heat conduction efficiency is enhanced to provide better heat dissipation effect for the communication chassis.

BACKGROUND OF THE INVENTION

It is known that the conventional electronic communication equipments are enclosed in a communication chassis. When operating, the electronic communication equipments generate high heat. The communication chassis is a closed cabinet, which is generally made of metal material by once casting. Owing to the limitation of the current casting technique, the material of the communication chassis has low thermal conductivity. As a result, the heat generated by the electronic communication equipments will be absorbed by the communication chassis to locally accumulate in certain areas of the interior of the communication chassis. The interior of the communication chassis has very low temperature uniformity so that the heat is hard to dissipate. That is, the temperature in those areas in contact with the electronic communication equipments is relatively high, while the temperature of other areas distal from the electronic communication equipments is much lower than the temperature of the areas in contact with the electronic communication equipments. In the case that the temperature rises to a value beyond a tolerable range, the reliability and lifetime of the electronic communication equipments will be significantly affected. Currently, a solution to the above problem is to enlarge the dimension of the communication chassis or improve the performances of the material of the communication chassis. However, such solution results in another problem of heavy weight of the communication chassis. Therefore, it has become an important topic how to quickly dissipate heat from the communication chassis at high efficiency under the precondition of not changing the dimension and weight of the communication chassis.

Figure 1:
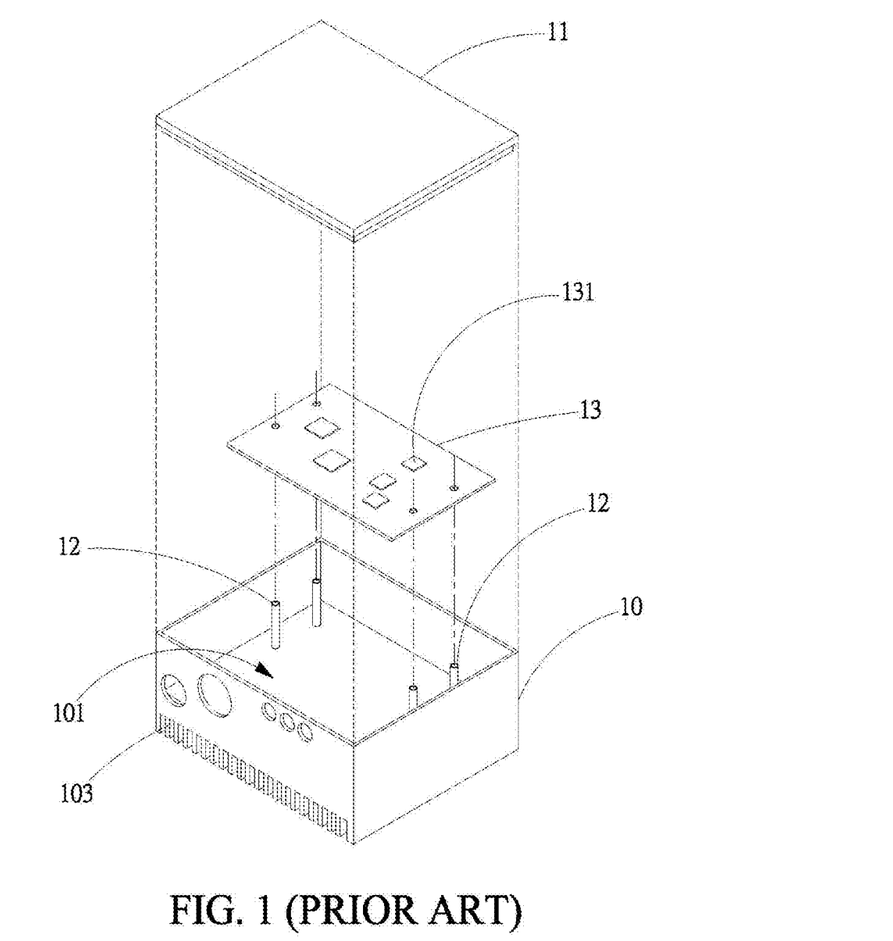
FIG. 1 is a perspective exploded view of a conventional communication chassis.

FIG. 1 is a perspective exploded view of a conventional communication chassis. As shown in FIG. 1, the communication chassis includes an enclosure 10, a cover body 11, two support posts 12 and a chassis board 13. The enclosure 10 has a receiving space 101 and multiple radiating fins 103 disposed on an outer face of the enclosure 10 opposite to the receiving space 101. The support posts 12 are disposed in one end of the receiving space 101 to string the chassis board 13. The cover body 11 is capped on one end of the enclosure 10 to enclose the chassis board 13, whereby the cover body 11 and the enclosure 10 together define a closed space.

When the chassis board 13 positioned in the communication chassis operates, multiple heat-generating components 131, (such as chips, CPU or other ICs), arranged on the chassis board 13 will generate high heat. Only minor part of the heat is transferred to the enclosure 10 and then dissipated to outer side by the radiating fins 103 simply by way of radiation, while major part of the heat remains in the receiving space 101 and is hard to dissipate quickly. No heat transfer medium, such as heat pipe or heat conduction element, is provided for the heat-generating components 131 of the chassis board 13. Therefore, the heat generated by the heat-generating components 131 can be hardly immediately transferred to the radiating fins 103 to dissipate the heat. As a result, in operation, the temperature in the communication chassis often rises quickly to result in poor quality of communication signals or even crash of the heat-generating components 131. In some more serious cases, the heat-generating components 131 may damage before its lifetime expires. According to the aforesaid, the conventional communication chassis has the following defects:

1. The conventional communication chassis has poor heat dissipation effect.
2. The communication equipments arranged in the conventional communication chassis are likely to crash.
3. The temperature in the conventional communication chassis often rises to result in poor quality of communication signals.
4. The lifetime of the communication equipments arranged in the conventional communication chassis is shortened.
5. The damage ratio of the communication equipments arranged in the conventional communication chassis is higher.

SUMMARY OF THE INVENTION

A primary object of the present invention is to provide an improved heat dissipation device for communication chassis, which includes an enclosure, a cover body and at least one second heat pipe assembly. The second heat pipe assembly penetrates through the radiating fins of the enclosure and the cover body for quickly and uniformly distributing heat to all the radiating fins. Therefore, the heat dissipation device provides excellent heat dissipation effect for the communication chassis.

A further object of the present invention is to provide the above heat dissipation device for communication chassis in which the second heat pipe assembly is connected with at least one thermal module for increasing heat dissipation area.

A still further object of the present invention is to provide the above heat dissipation device for communication chassis, which can enhance heat conduction efficiency of the communication chassis.

A still further object of the present invention is to provide the above improved heat dissipation device for communication chassis, which ensures stable quality of communication signals.

A still further object of the present invention is to provide the above heat dissipation device for communication chassis, which prolongs the lifetime of the equipments arranged in the communication chassis.

According to the above objects, the heat dissipation device for communication chassis of the present invention includes an enclosure and at least one second heat pipe assembly. The enclosure includes at least one first copper heat absorption component, at least one first heat pipe assembly and multiple radiating fins disposed on an outer surface of the enclosure. The first heat pipe assembly is connected with the first copper heat absorption component and a section not in contact therewith so as to transfer heat absorbed by the first copper heat absorption component to the section to dissipate the heat. The second heat pipe assembly penetrates through the radiating fins of the enclosure for quickly and uniformly distributing the heat to all the radiating fins. Therefore, the heat conduction efficiency is enhanced to provide better heat dissipation effect for the communication chassis.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 2:
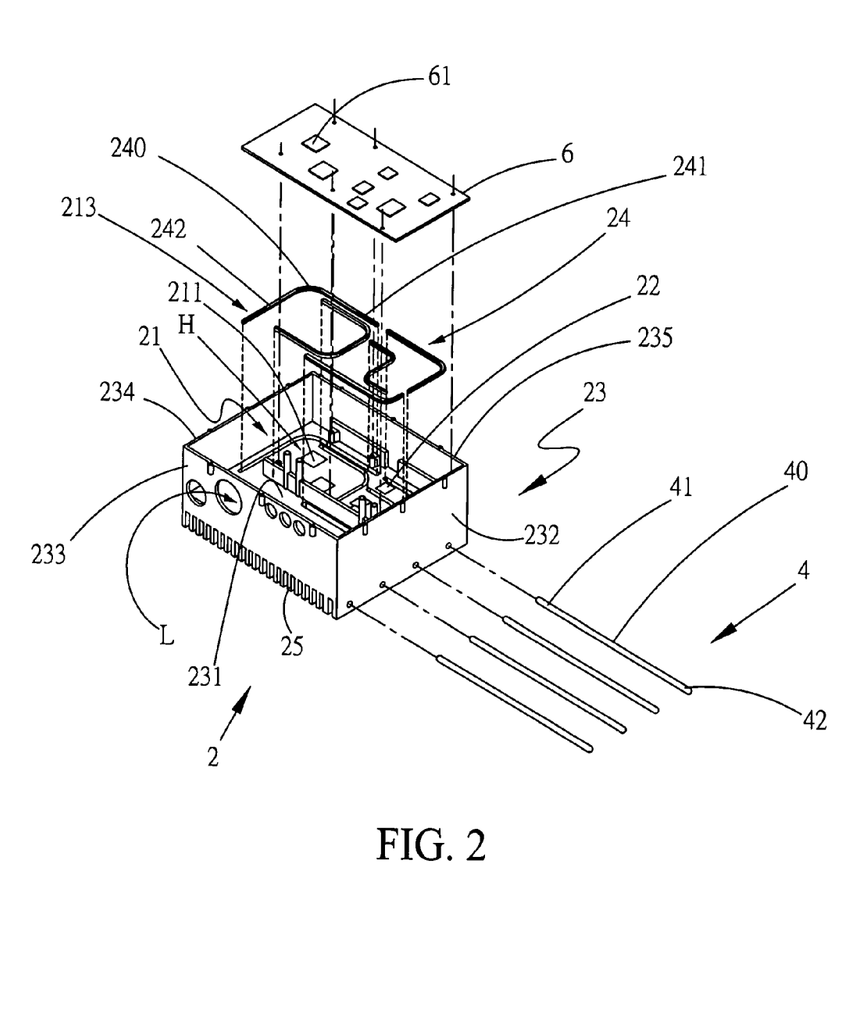
FIG. 2 is a perspective exploded view of the enclosure and the second heat pipe assembly of the present invention.
Figure 3:
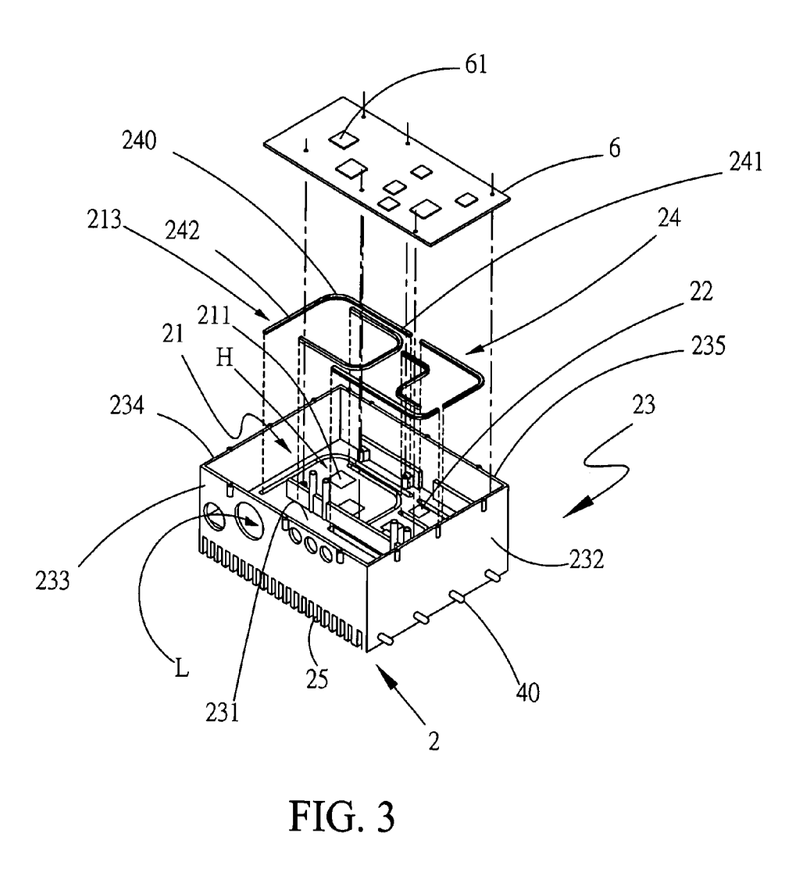
FIG. 3 is a perspective assembled view of the enclosure and the second heat pipe assembly of the present invention.

Please refer to FIGS. 2 and 3. According to a preferred embodiment, the heat dissipation device for communication chassis of the present invention includes an enclosure 2 and at least a second heat pipe assembly 4. The enclosure 2 includes at least one first copper heat absorption component 22, at least one first heat pipe assembly 24 and multiple radiating fins 25. The first heat pipe assembly 24 is connected with the first copper heat absorption component 22 and a section 23 not in contact with the first copper heat absorption component 23. The enclosure 2 includes at least one first copper heat absorption component 211 and at least one first heat pipe assembly 213. The first heat pipe assembly 213 is disposed in the receiving space 21 of the enclosure 2 and connected with the first copper heat absorption component 211 and a section 212 not in contact with the first copper heat absorption component 211. The first heat pipe assembly 24 serves to transfer heat absorbed by the first copper heat absorption component 22 to the section 23 to dissipate the heat. The section 23 not in contact with the first copper heat absorption component 22 is an area distal from the first copper heat absorption component 22 without contacting the first copper heat absorption component 22.

The enclosure 2 has a receiving space 21. The radiating fins 25 are disposed on a surface of the enclosure 2 opposite to the receiving space 21. That is, the radiating fins 25 are disposed on an outer surface of the enclosure 2. The second heat pipe assembly 4 penetrates through the radiating fins 25 of the enclosure 2 and has multiple second heat pipes 40. Each second heat pipe 40 has a second heat absorption end 41 and a second heat dissipation end 42. The second heat absorption end 41 extends along the outer surface of the enclosure 2 opposite to the first copper heat absorption component 22 and penetrates through the radiating fins 25 of the enclosure 2. The second heat dissipation end 42 extends in a direction away from the second heat absorption end 41 and penetrates through the radiating fins 25 of the enclosure 2. Accordingly, the second heat absorption end 41 of the second heat pipe 40 serves to quickly transfer the heat from the enclosure 2 and the radiating fins 25 to the second heat dissipation end 42. The second heat dissipation end 42 then quickly and uniformly distribute to the colder radiating fins 25 for more effectively dissipating the heat. Therefore, the heat conduction efficiency is greatly enhanced.

Please now refer to FIGS. 2, 3, 4, 5 and 6. The first heat pipe assembly 24 includes multiple first heat pipes 240 each having a first heat absorption end 241 adjacent to the first copper heat absorption component 22 and a first heat dissipation end 242 distal from the third copper heat absorption component 22. The heat absorbed by the first heat absorption end 241 is transferred to the first heat dissipation end 242 for dissipating the heat. In other words, the first heat absorption end 241 quickly transfers the heat absorbed by the first copper heat absorption component 22 to the first heat dissipation end 242, which primarily conducts the heat to the radiating fins 53 of the enclosure 2. The second heat pipe 40 further transfers the heat to the other not heated radiating fins 25 to distribute the heat. The first heat dissipation end 242 secondarily transfers the heat to the section 23 not in contact with the first copper heat absorption component 22 to dissipate the heat.

The first copper heat absorption component 22 has better thermal conductivity (or heat absorption capability) and is able to quickly absorb the heat. The first copper heat absorption component 22 has a first end face and a second end face. The first end face is flush with a bottom face of the enclosure 2. The second end face is embedded in the bottom face of the enclosure 2. The first copper heat absorption component 22 is integrally formed with the enclosure 2. The first copper heat absorption component 22 is in contact with at least one heat-generating component 61 to form a hot area H. The first copper heat absorption component 22 absorbs the heat generated by the heat-generating component 61 so that the temperature in the hot area H is higher than the temperature in any other area of the receiving space 21.

The enclosure 2 includes a first heat dissipation section 231, a second heat dissipation section 232, a third heat dissipation section 233, a fourth heat dissipation section 234 and a fifth heat dissipation section 235, which communicate with each other to form a cold area L. The cold area L is distal from the hot area H and not in contact with any heat-generating component 61. Accordingly, the temperature in the cold area L is lower than the temperature of the hot area H so that the cold area L serves as a heat dissipation area in the receiving space 21 for dissipating the heat. The first heat dissipation section 231 is disposed on a bottom face of the receiving space 21 and distal from the first copper heat absorption component 22. The second, third, fourth and fifth heat dissipation sections 232, 233, 234 and 235 are disposed on a periphery of the receiving space 21 in communication with each other. That is, two sides of the second heat dissipation section 232 are connected with one side of the third heat dissipation section 233 and one side of the fifth heat dissipation section 235 respectively. The fourth heat dissipation section 234 is positioned opposite to the second heat dissipation section 232 and two sides of the fourth heat dissipation section 234 are connected with the other side of the third heat dissipation section 233 and the other side of the fifth heat dissipation section 235 respectively. Accordingly, the second, third, fourth and fifth heat dissipation sections 232, 233, 234 and 235 are connected with each other to surround the receiving space 21.

The enclosure 2 is formed with at least one recess 214 for accommodating the first heat pipe 240. A first part of the recess 214 is adjacent to the first copper heat absorption component 22, while a second part of the recess 214 is adjacent to the section 23 not in contact with the first copper heat absorption component 22 and is adjacent to a periphery of the enclosure 2. That is, the first part of the recess 214 extends around the first copper heat absorption component 22 along the first heat absorption end 241 of the first heat pipe 240, while the second part of the recess 214 is distal from the first copper heat absorption component 22 and extends into contact with the section 23 and the enclosure 2 along the first heat dissipation end 242 of the first heat pipe 240. At least one chassis board 6 is rested in the receiving space 21. The heat-generating component 61 is disposed on the chassis board 6.

Figure 6:
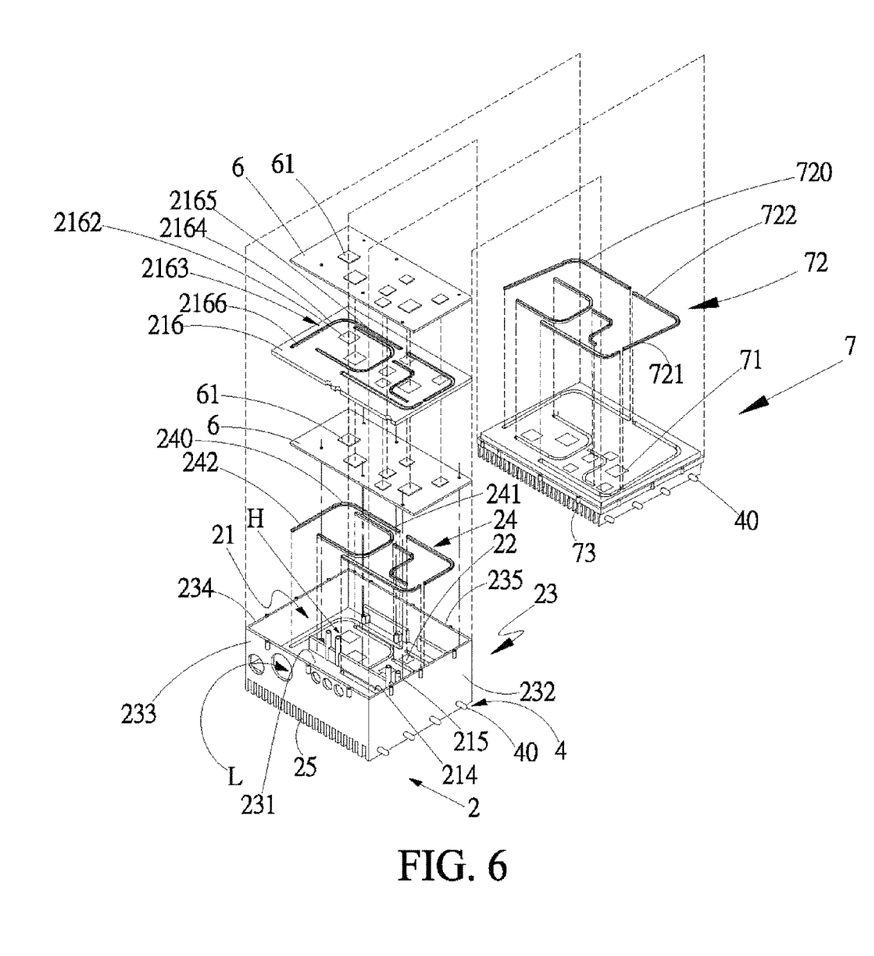
FIG. 6 is a perspective exploded view of a preferred embodiment of the present invention.
Figure 7:
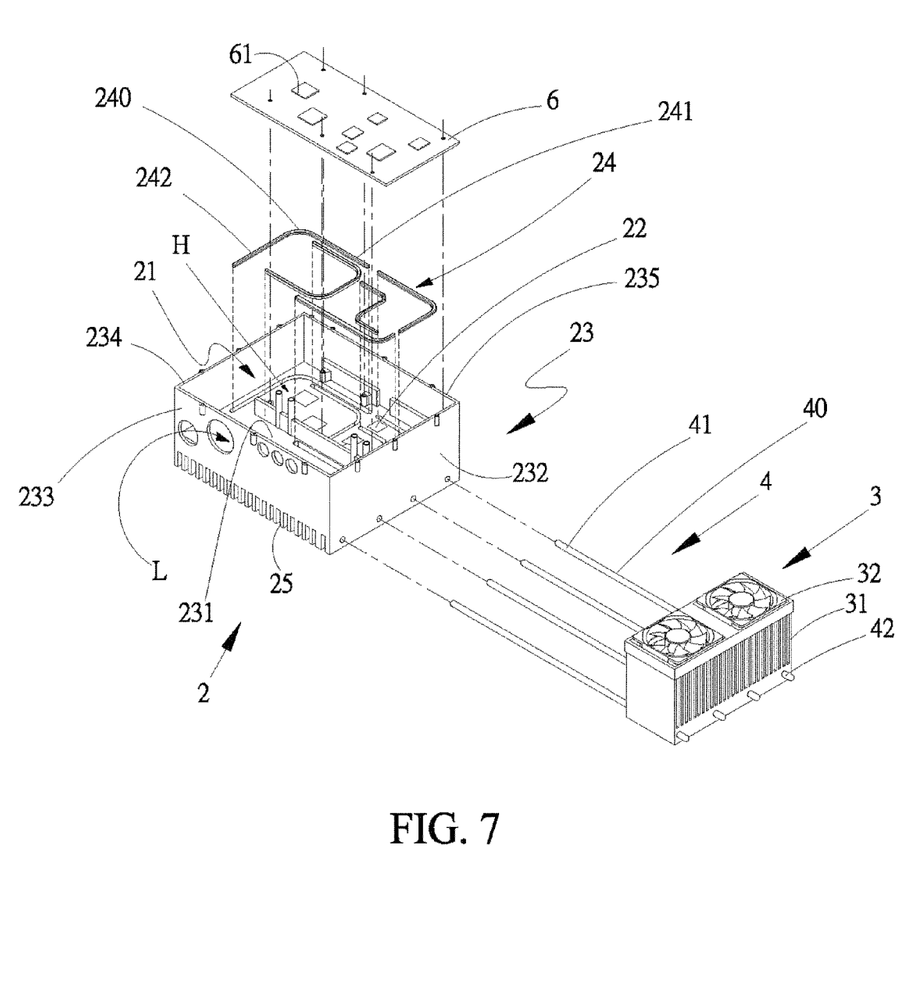
FIG. 7 is a perspective exploded view of the enclosure, the second heat pipe assembly and the thermal module of the present invention.
Figure 8:
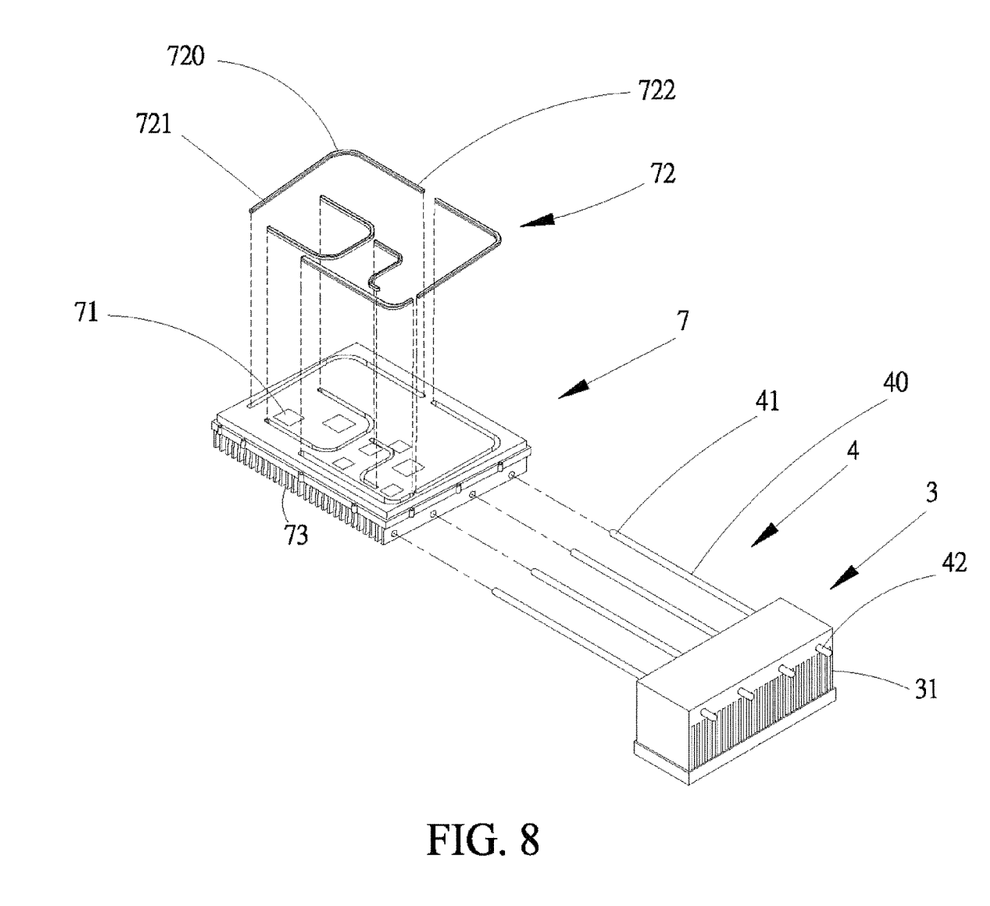
FIG. 8 is a perspective exploded view of the cover body, the second heat pipe assembly and the thermal module of the present invention.
Figure 9:
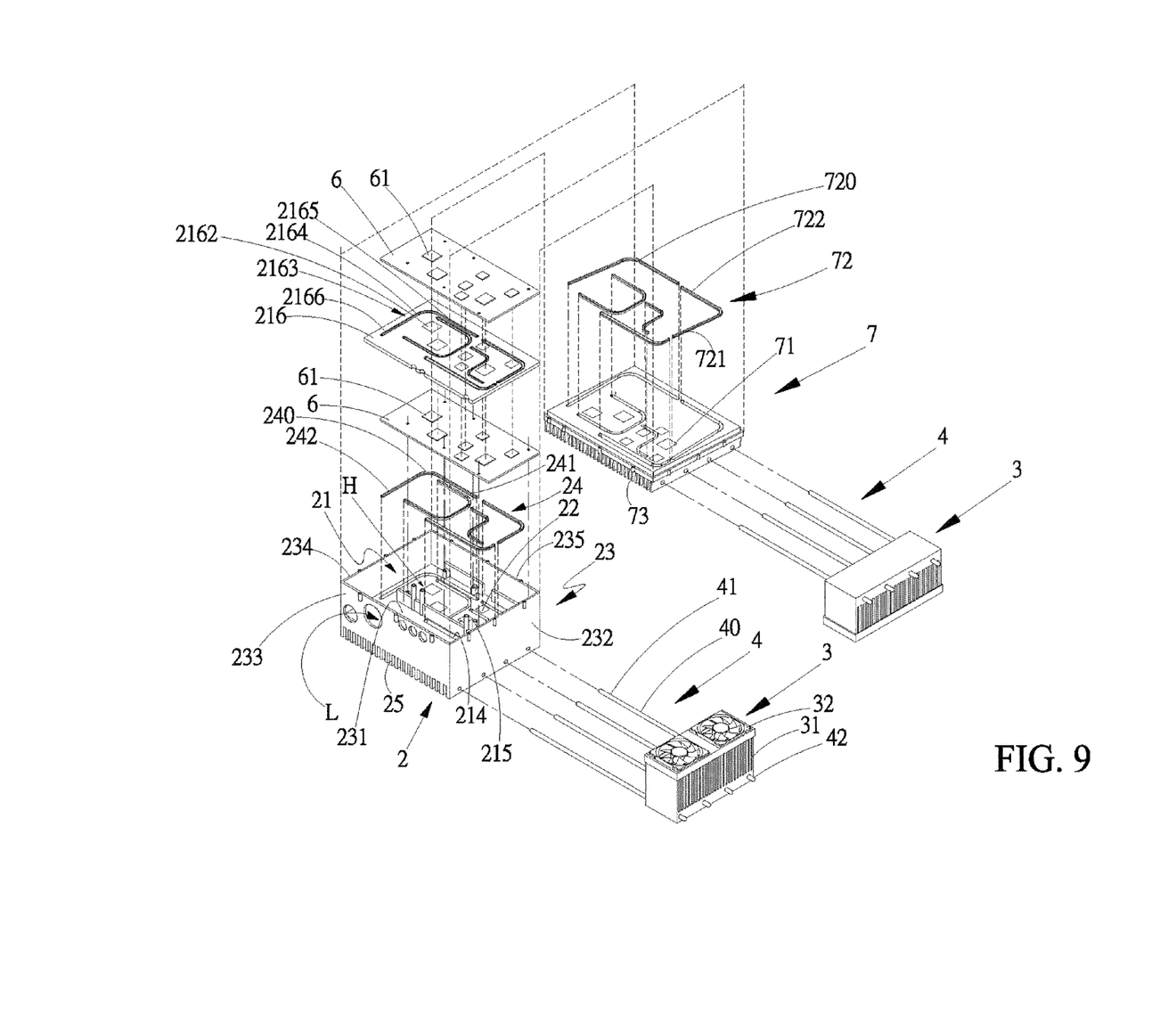
FIG. 9 is a perspective exploded view of another embodiment of the present invention.
Figure 10:
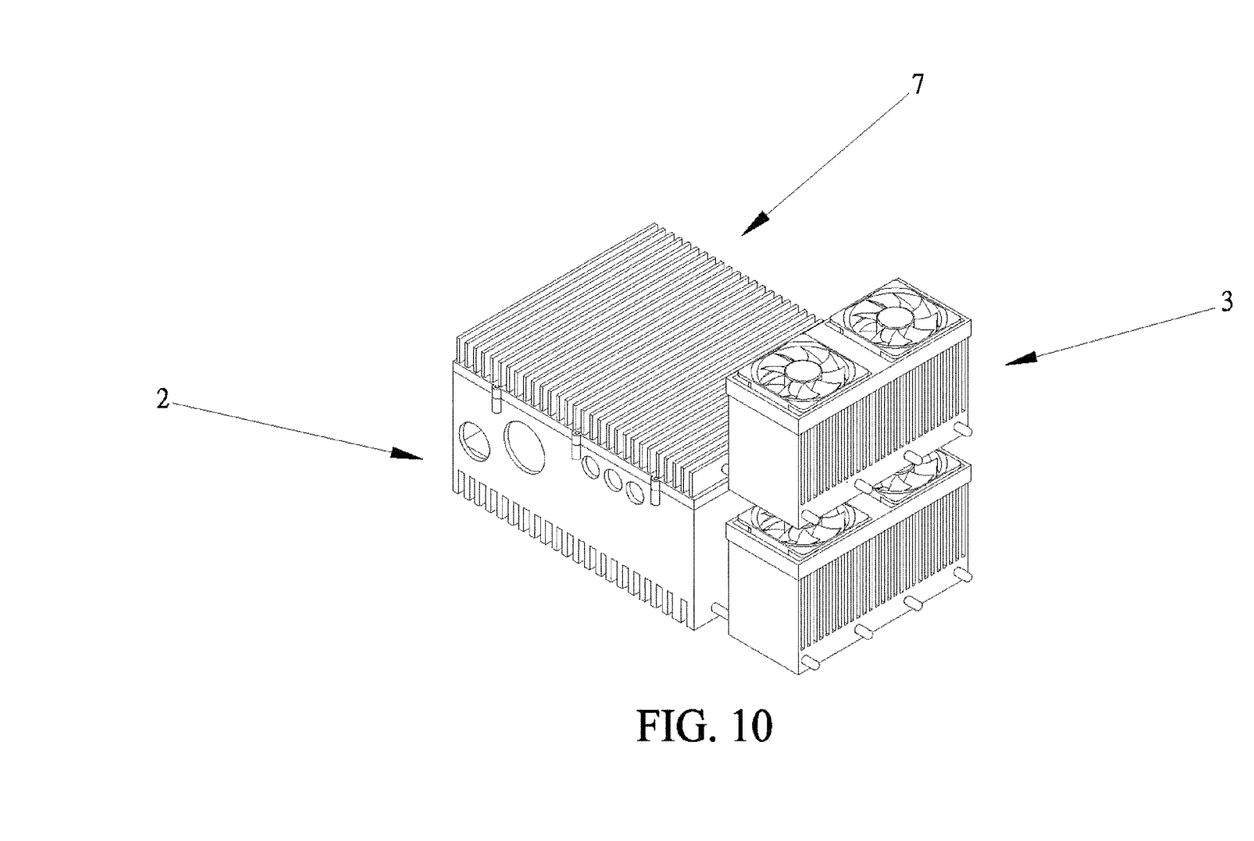
FIG. 10 is a perspective assembled view of the other embodiment of the present invention.

Please refer to FIG. 6. The heat dissipation structure of the present invention further includes at least one support element 215 and at least one heat conduction element 216. The support element 215 is disposed in the receiving space 21 of the enclosure 2 for supporting the chassis board 4. The heat conduction element 216 is disposed between two adjacent chassis boards 6. One end of the heat conduction element 216 tightly leans against an inner wall face of the receiving space 21. Each of two sides of the heat conduction element 216 has at least one second copper heat absorption component 2162, which abuts against the heat-generating component 61 of the chassis board 6 to form the hot area H. The second copper heat absorption component 2162 has better thermal conductivity (or heat absorption capability) so that the second copper heat absorption component 2162 can quickly absorb the heat generated by the heat-generating component 61 of the chassis board 6. The heat conduction element 216 can be a heat spreading board. Two opposite end faces of the second copper heat absorption component 2162 are flush with the surfaces of the heat conduction element 216 and the second copper heat absorption component 2162 is integrally formed with the heat conduction element 216.

The heat conduction element 216 further includes a third heat pipe assembly 2163. The third heat pipe assembly 2163 includes multiple third heat pipes 2164 each having a third heat absorption end 2165 adjacent to the second copper heat absorption component 2162 and a third heat dissipation end 2166 distal from the second copper heat absorption component 2162. The heat absorbed by the third heat absorption end 2165 is transferred through the third heat dissipation end 2166 to the section 23 not in contact with the first copper heat absorption component 22, (that is, the first to fifth heat dissipation sections 231, 232, 233, 234, 235), to dissipate the heat. Accordingly, the heat generated by the heat-generating component 61 is absorbed by the second copper heat absorption component 2162 and transferred through the third heat absorption end 2165 to the third heat dissipation end 2166. The third heat dissipation end 2166 then transfers the heat to the section 23, which dissipates the heat by way of radiation. Also, the second heat pipe 40 quickly transfers and distributes the heat from the radiating fins 25 of the enclosure 2 to the other radiating fins 25 to dissipate the heat.

Figure 4:
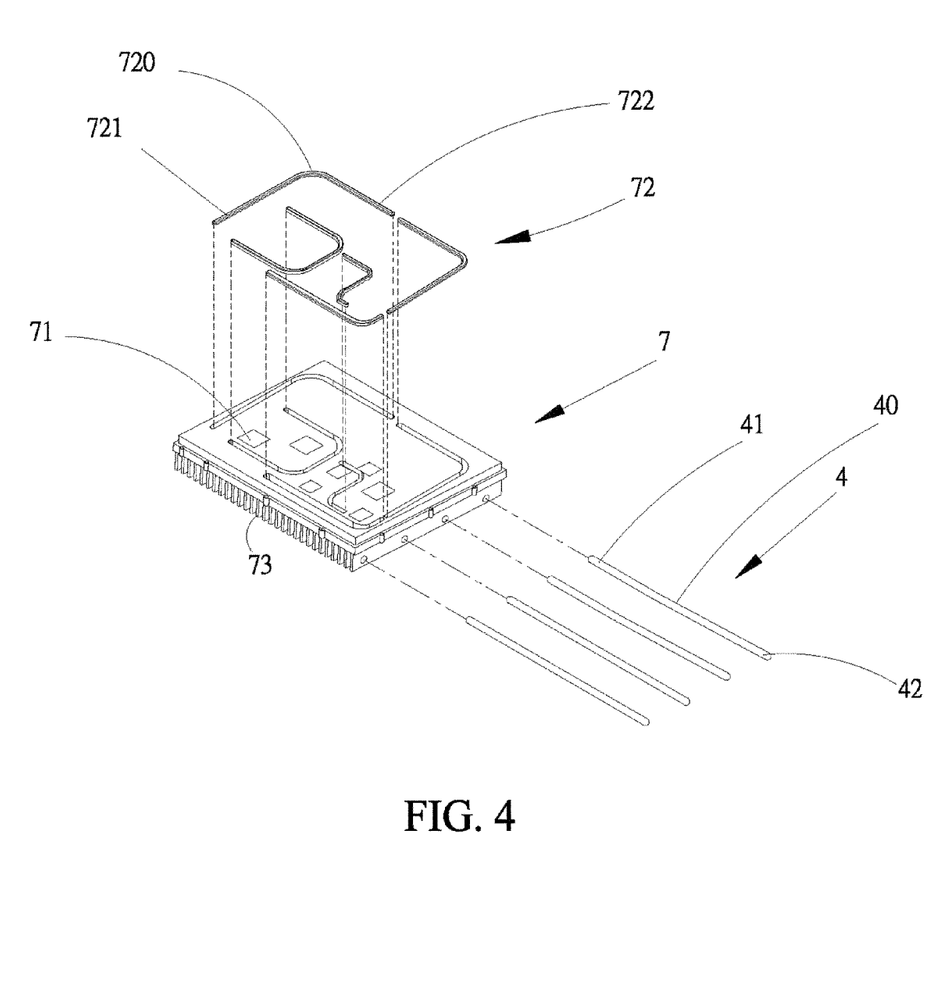
FIG. 4 is a perspective exploded view of the cover body and the second heat pipe assembly of the present invention.
Figure 5:
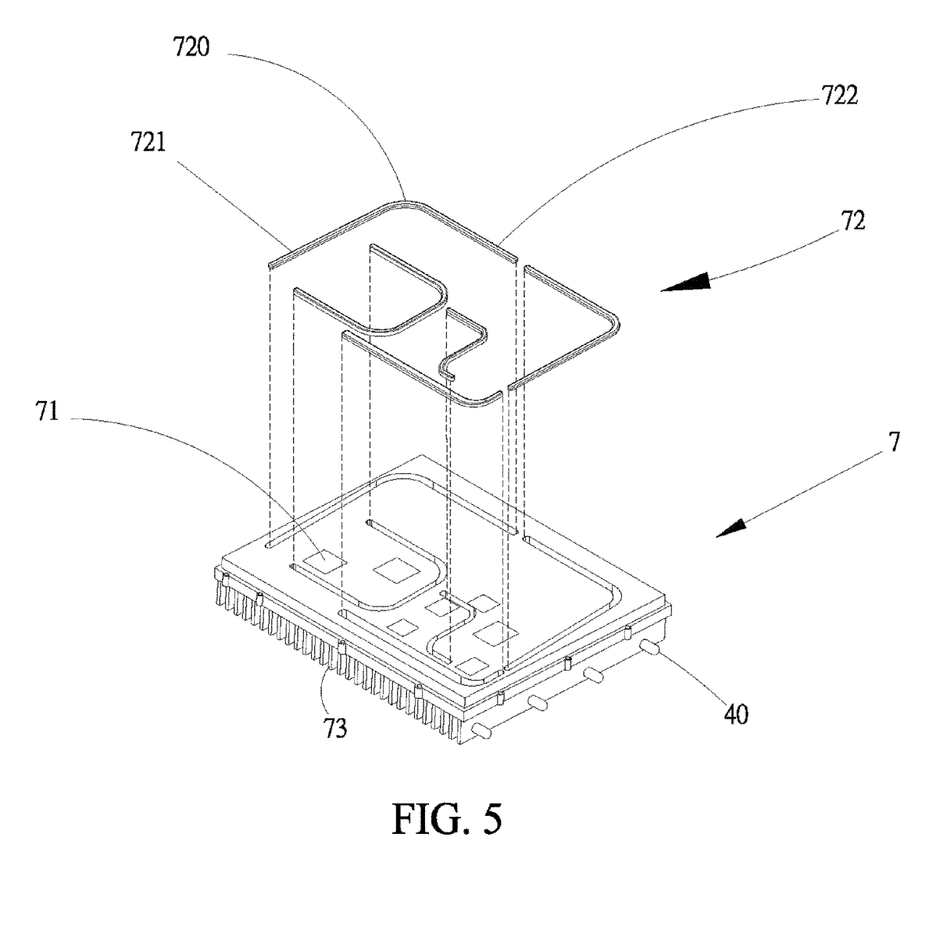
FIG. 5 is a perspective assembled view of the cover body and the second heat pipe assembly of the present invention.

Referring to FIGS. 4, 5 and 6, the enclosure 2 is mated with a cover body 7 having a first face facing the receiving space 21. At least one third copper heat absorption component 71 and at least one fourth heat pipe assembly 72 are disposed on the first face of the cover body 7. The cover body 7 further has a second face opposite to the first face. Multiple radiating fins 73 are disposed on the second face of the cover body 7. The second heat pipe 40 of the second heat pipe assembly 4 penetrates through the radiating fins 73. The third copper heat absorption component 71 abuts against the heat-generating component 61 to form the hot area H. The third copper heat absorption component 71 serves to absorb the heat generated by the heat-generating element 61 disposed on the chassis board 6. The third copper heat absorption component 71 is flush with the first face of the cover body 7 and the third copper heat absorption component 71 is integrally formed with the cover body 7. The second heat absorption end 41 extends along the second face of the cover body 7 opposite to the third copper heat absorption component 71 and penetrates through the radiating fins 73 of the cover body 7.

The second heat dissipation end 42 extends in a direction away from the second heat absorption end 41 and penetrates through the radiating fins 73 of the cover body 7.

The fourth heat pipe assembly 72 includes multiple fourth heat pipes 720 each having a fourth heat absorption end 721 adjacent to the third copper heat absorption component 71 and a fourth heat dissipation end 722 distal from the third copper heat absorption component 71. The heat absorbed by the fourth heat absorption end 721 is transferred through the fourth heat dissipation end 722 to the radiating fins 73 of the cover body 7 and the section 23 not in contact with the first copper heat absorption component 22 to dissipate the heat. Accordingly, the third copper heat absorption component 71 absorbs the heat generated by the heat-generating component 61 and transfers the heat through the fourth heat absorption end 721 to the fourth heat dissipation end 722. The fourth heat dissipation end 722 then transfers the heat to the section 23 not in contact with the first copper heat absorption component 22 and the radiating fins 73 of the cover body 7 to dissipate the heat. The second heat absorption end 41 of the second heat pipe 40 absorbs the heat from the radiating fins 73 of the cover body 7 and transfers and uniformly distributes the heat through the second heat dissipation end 42 to the other radiating fins 73 to quickly dissipate the heat.

Please now refer to FIGS. 2, 3, 4, 5 and 6, which illustrate the operation of the present invention as follows:

When the chassis board 6 arranged in the communication chassis works, the heat-generating component 61 of the chassis board 6 generates high heat. At this time, the first copper heat absorption component 22 absorbs the heat generated by the heat-generating component 61 of the chassis board 6. The first heat absorption end 241 of the first heat pipe 240 transfers the heat to the first heat dissipation end 242. The first heat dissipation end 242 further transfers the heat to the section 23 not in contact with the first copper heat absorption component 22, the enclosure 2 and the cover body 7 to dissipate the heat. The second heat absorption end 41 of the second heat pipe 40 quickly absorbs the heat from the radiating fins 25, 73 and transfers the heat to the second heat dissipation end 42. The second heat dissipation end 42 then uniformly distributes the heat to the radiating fins 25, 73 to quickly dissipate the heat by way of radiation. It should be noted that the second heat pipe 40 quickly and uniformly distributes major part of the heat to the radiating fins 25, 73 of the enclosure 2 and the cover body 7. Minor part of the heat is dissipated from the section 23 not in contact with the first copper heat absorption component 22, (that is, the first, second, third, fourth and fifth heat dissipation sections 2121, 2122, 2123, 2124 and 2125).

At the same time, the second copper heat absorption components 2162 of two sides of the heat conduction element 216 absorb the heat generated by the heat-generating components 61 of the corresponding chassis boards 6. The third heat absorption end 2165 of the third heat pipe 2164 transfers the heat to the third heat dissipation end 2166. The third heat dissipation end 2166 further transfers the heat to the section 23 not in contact with the first copper heat absorption component 22 for dissipating the heat. When the section 23 not in contact with the first copper heat absorption component 22 dissipates the heat, the heat is also transferred to the radiating fins 25, 73 of the enclosure 2 and the cover body 7. The second heat pipe 40 uniformly distributes the heat to the radiating fins 25, 73 through which the second heat pipe 40 penetrates so as to dissipate the heat by way of radiation and heat exchange with ambient air.

Accordingly, the second heat pipe 40 of the present invention not only can uniformly distribute the heat to the radiating fins 25, 73 of the enclosure 2 and the cover body 7 so as to speed heat dissipation thereof, but also can enhance heat conduction efficiency so as to more effectively remove the heat from the interior and exterior of the enclosure 2. Therefore, the chassis boards 6 arranged in the communication chassis can stably operate with excellent heat dissipation effect so as to ensure stable quality of communication signals and prolong lifetime of the equipments arranged in the communication chassis.

Please refer to FIGS. 7, 8, 9 and 10, which show a second embodiment of the present invention. The structure and the connection relationships between the components of the second embodiment are substantially identical to those of the first embodiment and thus will not be repeatedly described hereinafter. The second embodiment is different from the first embodiment in that the second heat pipe assembly 4 is connected with at least one thermal module 3. The thermal module 3 includes multiple radiating fins 31 and a fan 32 disposed on one side of the radiating fins 31 for forcedly carrying the heat away from the radiating fins 31. The second heat dissipation ends 42 of the second heat pipes 40 of the enclosure 2 and the cover body 7 are insert-connected with the radiating fins 31 of the thermal module 3 for transferring the heat from the radiating fins 25, 73 of the enclosure 2 and the cover body 7 to the thermal module 3 for dissipating the heat. In other words, the second heat dissipation ends 42 of the second heat pipes 40 quickly transfer the heat from the enclosure 2 and the cover body 7 and the radiating fins 25, 73 thereof to the second heat dissipation ends 42. The second heat dissipation ends 42 then transfer and distribute the heat to the thermal modules 3 for dissipating the heat. Therefore, the heat conduction efficiency is greatly enhanced.

Accordingly, by means of the cooperation between the second heat pipe assemblies 4 and the thermal modules 3, the thermal modules 3 not only help the radiating fins 25, 73 of the enclosure 2 and the cover body 7 to dissipate the heat, but also provide extra heat dissipation area.

Please now refer to FIGS. 7, 8, 9 and 10, which illustrate the operation of the second embodiment of the present invention as follows:

When the chassis board 6 arranged in the communication chassis works, the heat-generating component 61 of the chassis board 6 generates high heat. At this time, the first copper heat absorption component 22 absorbs the heat generated by the heat-generating component 61 of the chassis board 6. The first heat absorption end 241 of the first heat pipe 240 transfers the heat to the first heat dissipation end 242. The first heat dissipation end 242 further transfers the heat to the section 23 not in contact with the first copper heat absorption component 22, the enclosure 2 and the cover body 7 to dissipate the heat. The second heat absorption ends 41 of the second heat pipes 40 quickly absorb the heat from the radiating fins 25, 73 and transfer the heat to the second heat dissipation ends 42. The second heat dissipation ends 42 then uniformly distributes part of the heat to the radiating fins 25, 73 to dissipate the heat.

The second heat dissipation ends 42 also transfer other part of the heat to the radiating fins 31 of the thermal modules 3. The fans 32 then carry the heat away from the radiating fins 31 by way of forced convection.

At the same time, the second copper heat absorption components 2162 of two sides of the heat conduction element 216 absorb the heat generated by the heat-generating components 61 of the corresponding chassis boards 6. The third heat absorption end 2165 of the third heat pipe 2164 transfers the heat to the third heat dissipation end 2166. The third heat dissipation end 2166 further transfers the heat to the section 23 not in contact with the first copper heat absorption component 22. When the section 23 not in contact with the first copper heat absorption component 22 dissipates the heat, the heat is also transferred to the radiating fins 25, 73 of the enclosure 2 and the cover body 7. The second heat pipes 40 quickly distribute the heat to the radiating fins 25, 73 of the enclosure 2 and the cover body 7 and the radiating fins 31 of the thermal modules 3. The radiating fins 25, 73, 31 then dissipate the heat by way of radiation. The fans 32 then carry the heat away from the radiating fins 31 by way of forced convection.

Accordingly, by means of the connection between the second heat pipes 40 and the thermal modules 3, not only the enclosure 2 and the cover body 7 and the radiating fins 25, 73 thereof can be quickly dissipated, but also the thermal modules 3 provide extra heat dissipation area to more efficiently remove the heat from the interior and exterior of the enclosure 2. Therefore, the chassis boards 6 arranged in the communication chassis can stably operate with excellent heat dissipation effect so as to ensure stable quality of communication signals and prolong lifetime of the equipments arranged in the communication chassis.

In conclusion, the heat dissipation device for communication chassis of the present invention has the following advantages:

1. The heat dissipation device has better heat dissipation efficiency.
2. The heat dissipation device provides extra heat dissipation area.
3. The heat dissipation device has better heat conduction efficiency.
4. The heat dissipation device ensures stable quality of communication signals.
5. The heat dissipation device prolongs the lifetime of the equipments arranged in the communication chassis.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat dissipation device for communication chassis, comprising:
    an enclosure, the enclosure including at least one first copper heat absorption component, multiple radiating fins and at least one first heat pipe assembly, the radiating fins being disposed on an outer surface of the enclosure, the first heat pipe assembly being connected with the first copper heat absorption component and a section not in contact with the first copper heat absorption component, whereby the first heat pipe assembly transfers heat absorbed by the first copper heat absorption component to the section not in contact with the first copper heat absorption component to dissipate the heat;

at least one second heat pipe assembly penetrating through the radiating fins of the enclosure; and wherein the first copper heat absorption component has a first end face flush with a bottom face of the enclosure and a second end face embedded in the bottom face of the enclosure, the first copper heat absorption component being integrally formed with the enclosure.

2. The heat dissipation device for communication chassis as claimed in claim 1, wherein the second heat pipe assembly is connected with at least one thermal module, the thermal module including multiple radiating fins and a fan disposed on one side of the radiating fins, the second heat pipe assembly being insert-connected with the radiating fins of the thermal module for transferring the heat from the radiating fins of the enclosure to the thermal module for dissipating the heat.

3. The heat dissipation device for communication chassis as claimed in claim 2, wherein the enclosure has a receiving space.

4. The heat dissipation device for communication chassis as claimed in claim 2, wherein the second heat pipe assembly includes multiple second heat pipes each having a second heat absorption end and a second heat dissipation end, the second heat absorption end extending along the outer surface of the enclosure opposite to the first copper heat absorption component and penetrating through the radiating fins of the enclosure, the second heat dissipation end extending in a direction away from the second heat absorption end and penetrating through the radiating fins of the enclosure.

5. The heat dissipation device for communication chassis as claimed in claim 3, wherein the first copper heat absorption component is in contact with at least one corresponding heat-generating component to form a hot area.

6. The heat dissipation device for communication chassis as claimed in claim 1, wherein the first heat pipe assembly includes multiple first heat pipes each having a first heat absorption end and a first heat dissipation end, the first heat absorption end being adjacent to the first copper heat absorption component, the first heat dissipation end being distal from the first copper heat absorption component.

7. The heat dissipation device for communication chassis as claimed in claim 3, wherein the enclosure includes a first heat dissipation section, a second heat dissipation section, a third heat dissipation section, a fourth heat dissipation section and a fifth heat dissipation section, which communicate with each other to form a cold area, the first heat dissipation section being disposed on a bottom face of the receiving space and distal from the first copper heat absorption component, the second, third, fourth and fifth heat dissipation sections being disposed along a periphery of the receiving space.

8. The heat dissipation device for communication chassis as claimed in claim 5, wherein at least one chassis board is rested in the receiving space, the heat-generating component being disposed on the chassis board.

9. The heat dissipation device for communication chassis as claimed in claim 3, wherein the enclosure has at least one recess for accommodating the first heat pipe assembly, a first part of the recess being adjacent to the first copper heat absorption component, while a second part of the recess being adjacent to the section not in contact with the first copper heat absorption component and adjacent to a periphery of the enclosure.

10. The heat dissipation device for communication chassis as claimed in claim 8, further comprising at least one support element and at least one heat conduction element, the support element being disposed in the receiving space of the enclosure for supporting the chassis board, the heat conduction element being disposed between two adjacent chassis boards, each of two sides of the heat conduction element having at least one second copper heat absorption component, which abuts against the heat-generating component of the chassis board to form the hot area.

11. The heat dissipation device for communication chassis as claimed in claim 10, wherein two opposite end faces of the second copper heat absorption component are flush with surfaces of the heat conduction element and the second copper heat absorption component is integrally formed with the heat conduction element.

12. The heat dissipation device for communication chassis as claimed in claim 10, wherein the heat conduction element includes a third heat pipe assembly, the third heat pipe assembly including multiple third heat pipes each having a third heat absorption end adjacent to the second copper heat absorption component and a third heat dissipation end distal from the second copper heat absorption component, whereby the third heat absorption end absorbs the heat and transfers the heat through the third heat dissipation end to the section not in contact with the first copper heat absorption component to dissipate the heat.

13. The heat dissipation device for communication chassis as claimed in claim 1, wherein the enclosure is mated with a cover body having a first face facing a receiving space, at least one third copper heat absorption component being disposed on the first face of the cover body, the cover body further having a second face opposite to the first face, multiple radiating fins being disposed on the second face of the cover body, the second heat pipe assembly penetrating through the radiating fins of the cover body, the third copper heat absorption component abutting against at least one heat-generating component to form a hot area.

14. The heat dissipation device for communication chassis as claimed in claim 13, wherein the third copper heat absorption component is flush with the first face of the cover body and the third copper heat absorption component is integrally formed with the cover body.

15. The heat dissipation device for communication chassis as claimed in claim 13, wherein the cover body has a fourth heat pipe assembly, the fourth heat pipe assembly including multiple fourth heat pipes each having a fourth heat absorption end adjacent to the third copper heat absorption component and a fourth heat dissipation end distal from the third copper heat absorption component, the fourth heat absorption end absorbing the heat and transferring the heat through the fourth heat dissipation end to the radiating fins of the cover body and the section not in contact with the first copper heat absorption component to dissipate the heat.

16. The heat dissipation device for communication chassis as claimed in claim 13, wherein the second heat pipe assembly includes multiple second heat pipes each having a second heat absorption end and a second heat dissipation end, the second heat absorption end extending along the second face of the cover body opposite to the third copper heat absorption component and penetrating through the radiating fins of the cover body, the second heat dissipation end extending in a direction away from the second heat absorption end and penetrating through the radiating fins of the cover body.

* * * * *